United States Patent
Sridharan et al.

(10) Patent No.: US 8,737,133 B2
(45) Date of Patent: May 27, 2014

(54) SHIFTING CELL VOLTAGE BASED ON GROUPING OF SOLID-STATE, NON-VOLATILE MEMORY CELLS

(75) Inventors: Arvind Sridharan, Longmont, CO (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 171 days.

(21) Appl. No.: 13/275,675

(22) Filed: Oct. 18, 2011

(65) Prior Publication Data

US 2013/0094290 A1     Apr. 18, 2013

(51) Int. Cl.
    *G11C 11/34*     (2006.01)
(52) U.S. Cl.
    USPC .............. 365/185.2; 365/185.24; 365/185.21; 365/185.03
(58) Field of Classification Search
    USPC ................ 365/185.2, 185.24, 185.21, 185.03
    See application file for complete search history.

(56) References Cited

U.S. PATENT DOCUMENTS

| | | | |
|---|---|---|---|
| 6,044,019 A | 3/2000 | Cernea et al. | |
| 6,522,580 B2 | 2/2003 | Chen et al. | |
| 7,023,735 B2 | 4/2006 | Ban et al. | |
| 7,558,109 B2 | 7/2009 | Brandman et al. | |
| 7,593,259 B2 | 9/2009 | Kim | |
| 7,663,914 B2 | 2/2010 | Lee | |
| 7,903,468 B2 | 3/2011 | Litsyn et al. | |
| 7,944,757 B2 | 5/2011 | Moschiano et al. | |
| 7,945,825 B2 | 5/2011 | Cohen et al. | |
| 7,974,132 B2 | 7/2011 | Cornwell et al. | |
| 7,990,764 B2 | 8/2011 | Alrod et al. | |
| 8,000,135 B1 | 8/2011 | Perlmutter et al. | |
| 8,000,141 B1 | 8/2011 | Shalvi et al. | |
| 8,077,520 B1 | 12/2011 | Yang et al. | |
| 8,331,169 B1 | 12/2012 | Yang et al. | |
| 8,345,477 B1 | 1/2013 | Yang | |
| 8,351,258 B1 * | 1/2013 | Yang et al. | 365/185.03 |
| 8,363,501 B1 | 1/2013 | Ramamoorthy et al. | |
| 8,498,152 B2 | 7/2013 | Alrod et al. | |
| 8,531,888 B2 | 9/2013 | Chilappagari et al. | |
| 2005/0013165 A1 | 1/2005 | Ban | |
| 2006/0028875 A1 | 2/2006 | Avraham et al. | |

(Continued)

FOREIGN PATENT DOCUMENTS

| | | |
|---|---|---|
| WO | WO2008078314 | 7/2008 |
| WO | WO2011008367 | 1/2011 |
| WO | WO2011094454 | 8/2011 |

OTHER PUBLICATIONS

U.S. Appl. No. 13/475,418, filed Oct. 18, 2011, Patapoutian et al.

(Continued)

*Primary Examiner* — Vu Le
*Assistant Examiner* — Han Yang
(74) *Attorney, Agent, or Firm* — Hollingsworth Davis, LLC

(57) ABSTRACT

Cells of a solid-state, non-volatile memory are assigned to one of a plurality of groups. Each group is defined by expected symbols stored in the cells in view of actual symbols read from the cells. Based on cell counts within the groups, it can be determined that a shift in a reference voltage will reduce a collective bit error rate of the cells. The shift can be applied to data access operations affecting the cells.

14 Claims, 10 Drawing Sheets

(56) References Cited

U.S. PATENT DOCUMENTS

| | | | |
|---|---|---|---|
| 2008/0002464 A1 | 1/2008 | Maayan | |
| 2008/0244339 A1* | 10/2008 | Kong et al. | 714/704 |
| 2009/0287975 A1 | 11/2009 | Kim et al. | |
| 2010/0034019 A1 | 2/2010 | Kang et al. | |
| 2010/0091535 A1 | 4/2010 | Sommer et al. | |
| 2010/0118608 A1 | 5/2010 | Song et al. | |
| 2010/0191931 A1* | 7/2010 | Kim | 711/170 |
| 2010/0199149 A1 | 8/2010 | Weingarten et al. | |
| 2011/0038212 A1 | 2/2011 | Uchikawa et al. | |
| 2011/0066902 A1 | 3/2011 | Sharon et al. | |
| 2011/0066922 A1 | 3/2011 | Wezelenburg et al. | |
| 2011/0069521 A1 | 3/2011 | Elfadel et al. | |
| 2011/0141827 A1 | 6/2011 | Mozak et al. | |
| 2011/0182118 A1 | 7/2011 | Litsyn et al. | |
| 2011/0216598 A1 | 9/2011 | Kim et al. | |

OTHER PUBLICATIONS

U.S. Appl. No. 13/475,497, filed Oct. 18, 2011, Sridharan et al.
U.S. Appl. No. 13/475,598, filed Oct. 18, 2011, Sridharan et al.
Yaakobi et al., "Error Characterization and Coding Schemes for Flash Memories", GLOBECOM Workshops, 2010, IEEE, 5 pages.
Jul. 3, 2013, File History for U.S. Appl. No. 13/275,497.
U.S. Appl. No. 13/275,497, filed Oct. 18, 2011, Sridharan et al.
U.S. Appl. No. 13/275,418, filed Oct. 18, 2011, Patapoutian et al.
2008, Mielke et al., "Bit Error Rate in NAND Flash Memories", 46$^{th}$ Annual International Reliability Physics Symposium, Phoenix, 2008, pp. 9-19.
U.S. Appl. No. 13/275,598, filed Oct. 18, 2011, Sridharan et al.
Nov. 1, 2013, File History for U.S. Appl. No. 13/275,497.
Nov. 12, 2013 File History for U.S. Appl. No. 13/275,598.
Nov. 12, 2013, File History for U.S. Appl. No. 13/275,418.

* cited by examiner

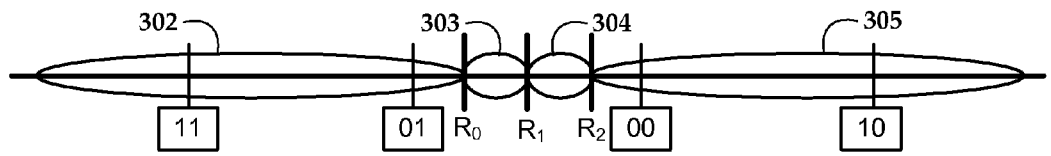
*FIG. 3A*
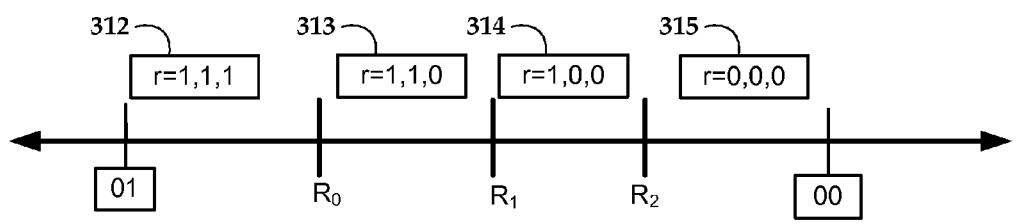
*FIG. 3B*
| | SOFT READ RESULT | | | |
|---|---|---|---|---|
| 320 | [1,1,1] | [1,1,0] | [1,0,0] | [0,0,0] |
| EXPECTED LSB OR MSB VALUE — 0 | p(0, [1,1,1]) | p(0, [1,1,0]) | p(0, [1,0,0]) | p(0, [0,0,0]) |
| EXPECTED LSB OR MSB VALUE — 1 | p(1, [1,1,1]) | p(1, [1,1,0]) | p(1, [1,0,0]) | p(1, [0,0,0]) |
*FIG. 3C*

SHIFTING CELL VOLTAGE BASED ON GROUPING OF SOLID-STATE, NON-VOLATILE MEMORY CELLS

CROSS-REFERENCE TO RELATED APPLICATIONS

This application is related to U.S. Publication Nos. 2013/0094288, 2013/0094289 and 2013/0094286 filed on even date herewith, the content of which is incorporated by reference in its entirety.

SUMMARY

The present disclosure is related to systems and methods for managing errors in non-volatile, solid-state memory. For example, in one embodiment, a method, apparatus, and/or computer readable medium facilitates assigning cells of a solid-state, non-volatile memory to one of a plurality of groups. Each group is defined by expected symbols stored in the cells in view of actual symbols read from the cells. Based on cell counts within the groups, it can be determined that a shift in a reference voltage will reduce a collective bit error rate of the cells. The shift can be applied to data access operations affecting the cells.

In another embodiment, multi-level cells of a solid-state, non-volatile memory are assigned to one of a plurality of groups p(b,r), where p(b,r) refers to a number of cells having expected symbol values of b being read in voltage region r, and where r represents regions adjacent a reference voltage. The regions are used to determine the symbol values of b. Based on evaluating an expression based on p(r,b), the reference voltage is adjusted to reduce a collective bit error rate of the cells.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same components in multiple figures.

FIGS. 3A-3C are block diagrams illustrating categories of soft read results and errors according to an example embodiment;

DETAILED DESCRIPTION

Figure 1A:
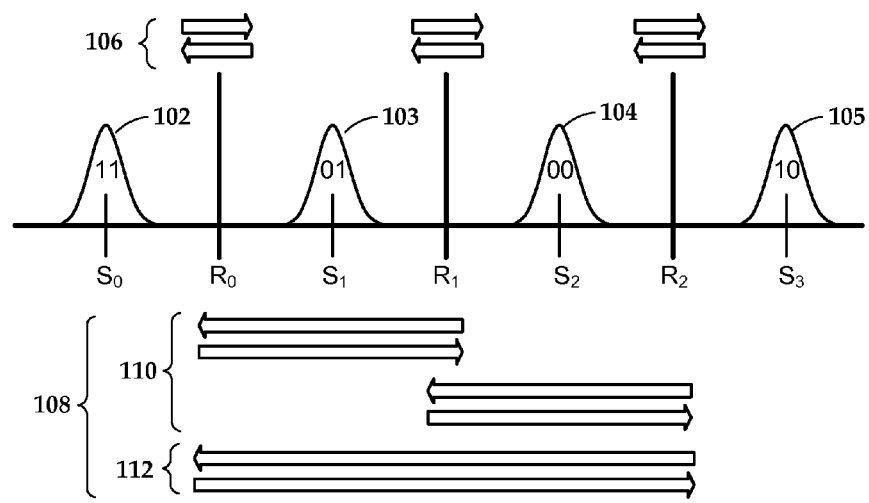
FIG. 1A is a graph illustrating categories of memory errors according to example embodiments.

In the following description of various example embodiments, reference is made to the accompanying drawings that form a part hereof, and in which is shown by way of illustration various example embodiments. It is to be understood that other embodiments may be utilized, as structural and operational changes may be made without departing from the scope of the claims appended hereto.

The present disclosure is generally related to solid-state, non-volatile memory. In many implementations, solid-state, non-volatile memory uses cells similar to a metal-oxide semiconductor (MOS) field-effect transistor (FET), e.g., having a gate (control gate), a drain, and a source. The cells also include what is known as a "floating gate" that can retain a charge in the absence of external power. When a selected voltage is applied to the control gate, differing values of current may flow through the channel depending on the amount of charge on the floating gate. This current flow can be used to characterize two or more states of the cell that represent data stored in the cell.

The discussion below makes reference to flash memory, which may include NOR flash, NAND flash, 2D NAND flash, 3D NAND flash (also called vertical NAND, or VNAND) and various other technology types. These types of flash memory may be divided into two different classifications: single-level and multi-level cell memory. Single level cell (SLC) flash memory uses floating gate memory cells that store one bit of data per cell by distinguishing between two floating gate voltage levels. In contrast, multi-level cell (MLC) flash memory can be programmed to store two or more bits of information using more than two floating gate voltage levels. Because it can store more data per cell, MLC flash memory is less expensive than SLC on a per-byte basis. However, MLC flash memory has lower margin for error due to the increased resolution needed to differentiate between voltage levels. As a result, MLC may be more error-sensitive than SLC flash memory in response to such factors as repeated use (e.g., wear) and leakage of charge over time (e.g., data retention errors).

In general, a memory cell may be programmed to a number of voltages, M, where M can represent any of $2^m$ memory states. The value m is equal to the number of bits stored, and is greater than 1 for MLC memory. For example, memory cells programmable to four voltages can store two bits per cell (M=4, m=2); memory cells programmable to eight voltages have a storage capacity of three bits per cell (M=8, m=3), etc. While specific examples below are illustrated as two-bit-per-cell, MLC NAND flash memory, it is not intended that the concepts and embodiments described herein be solely limited to this type of memory. For example, while MLC may be often used in the industry to refer to only two-bit per cell memory, in the present disclosure, MLC may refer to any number of multiple bits per cell. The categorization of errors and other features described below may be applicable to other types of non-volatile, solid state memory, e.g., those devices that share analogous features of the MLC NAND flash devices described herein.

An example of how data is stored a two-bit per cell MLC device is shown in the graph of FIG. 1A. The digital states/symbols 11, 01, 00, 10 are associated with voltages distributions 102-105 respectively. The voltages $S_0$ through $S_3$ are respective center/average voltage levels for each of the distributions 102-105. Voltages $R_0$-$R_2$ are reference voltages that serve as boundaries between each of the states/symbols. For example, after programming a value of 01 in a cell, the cell should exhibit a read voltage that falls somewhere in distribution 103 if the cell is properly functioning. However, if the actual voltage read for this cell is instead less than $R_0$ or greater than $R_1$, then a bit error may occur when the cell is read. In the discussion that follows, the voltages $R_0$-$R_2$ may be referred to alternatively as reference voltages and/or boundary voltages. The voltages $S_0$-$S_3$ may also be described as reference voltages, although of a different type than $R_0$-$R_2$.

Figure 1B:
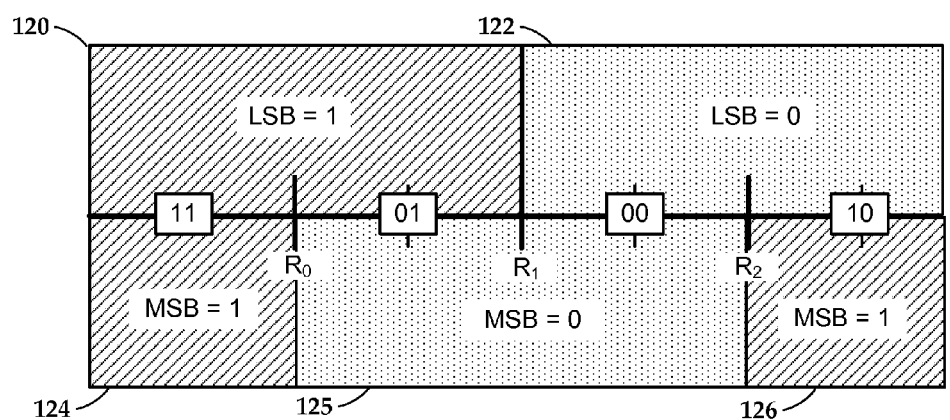
FIG. 1B is a graph illustrating voltage regions for reading least and most significant bits according to example embodiments.

It should be noted that in an arrangement such as shown in FIG. 1A, the two bits in each cell need not be associated with the same word or page. For example, a memory system may be arranged so that the leftmost bit (most significant bit, or MSB) is associated with one word/page, and the rightmost bit (least significant bit, or LSB) is associated with another word/page. This arrangement may be referred to herein as "multi-page," and can be seen by way of example in the graph of FIG. 1B. In this arrangement, if a page utilizes the LSB of the symbol, then the data associated with the cell can be determined based only whether the read voltage is to the left or the right of $R_1$, as indicated by regions 120 and 122. Similarly, if the MSB of the symbol is utilized, the value can be determined based on whether or not the read voltage is between $R_0$ and $R_2$, as indicated by regions 124-126.

A variety of ECC algorithms are known that can correct a known number of bit errors for a predefined word size and number of ECC bits. Flash systems may use multiple levels of error coding (e.g., inner and outer coding) to improve overall error correction performance. The ECC is associated with a bit error rate (BER) metric that is used to gauge flash and error correction performance in general. However, BER may not take into account the underlying causes of the errors, such as whether the error represents a common or unusual physical deviation for the type of media involved. As seen in FIG. 1A, the term "physical deviations" may at least refer to how far and/or in what direction an actual voltage is located compared to what it is expected to be if there were no error.

Generally, a bit error occurs when the read voltage representing the data deviates from its expected range of values. Thus, in reference again to FIG. 1A, if the voltage originally programmed to be in the range 102 was later read-back as being in the adjacent range 103, then a one-bit error ("01" instead of "11") would occur. A one-bit error would also occur if the threshold voltage was instead in the range 105 ("10" instead of "11"). However, the latter case may represent a more serious physical problem with the underlying cell than the former, because the deviation in the latter case is significantly larger than the former. The existence and extent of these types of deviations may not be apparent when looking at BER alone.

In FIG. 1A, arrows generally indicated by reference numeral 106 and 108, represent different categories of errors that may be manifested by a memory device according to example embodiments. These arrows 106, 108 may be referred to herein alternately as voltage shifts and/or errors. The arrows 106, 108 represent a change in floating gate voltage thresholds from an expected level to an actual, measured level. For purposes of this discussion, the term "expected levels" at least refers to a range of voltage thresholds that should be exhibited by the cell during a read operation, typically without applying any ECC to correct bit errors. The expected levels may differ somewhat from nominal and/or ideal levels, based on such factors as cell age, elapsed time since the data was written, environmental conditions, etc. The operation during which the "actual" voltage value is determined may occur during any type of data access operation, including reads, writes, erasures, etc. If the actual measurement is different than the expected to the extent that a bit error would occur, the arrows 106, 108 indicate a direction and magnitude of that difference.

For the four-level MLC shown in FIG. 1A, there are twelve total errors in two groupings 106, 108. The number of these types of errors may be generally represented as $M*(M-1)$, where M is the number of different voltage levels used to store data in each cell. The first group of errors 106 represents shifts that cause the actual voltages to be located in voltage ranges 102-105 that are adjacent to the expected ranges. There are six $(2M-2)$ of these types of errors 106 for two-bit per cell MLC memory. For example, reading a "11" when a "01" was programmed indicates the actual voltage shifted to the left across the $R_0$ boundary.

The second group of errors 108 represents shifts that cause the actual measurements to be located in voltage ranges 102-105 that are not adjacent to the expected voltage ranges 102-105. There are six $(M^2-3M+2)$ of these types of errors 108 for two-bit per cell MLC memory. This group 108 is broken into two subgroups, 110 and 112. Subgroup 110 represents shifts of more than one voltage range, and subgroup 112 represents shifts of more than two voltage ranges.

Figure 2:
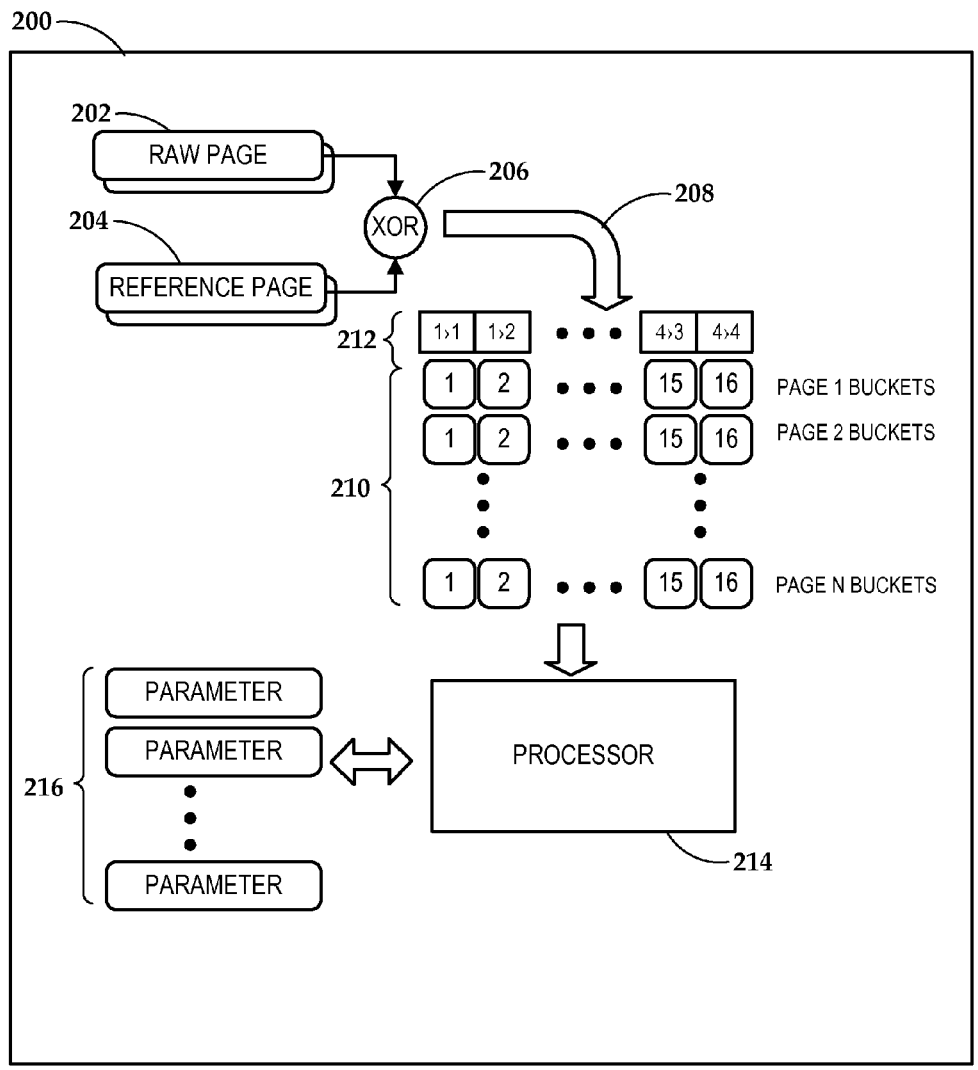
FIG. 2 is a block diagram of a system according to an example embodiment.

In reference now to FIG. 2, a block diagram illustrates a system 200 for categorizing errors according to example embodiments. Generally, the system 200 may be implemented within a self-contained memory device, and/or may include functional components outside the device (e.g., a host). The system 200 compares raw page data 202 to reference page data 204 via a bitwise XOR operator 206.

The reference page data 204 is intended to represent a "correct" version of what is actually stored in the raw page data 202. As a result, the system 200 may take additional measures to ensure the reference page data 204 can be read back correctly and reliably. For example, the reference page data 204 may include user data stored with extra ECC to ensure successful decoding even if there are large numbers of read errors. In other arrangements, extra copies of the data 204 may be stored in areas known to have high reliability, the data 204 may determined/reconstructed from external resources (e.g., a host), etc. Or, the reference data 204 may include a known pattern that does not require decoding from programmable memory, e.g., may be coded into firmware or hardware.

The raw page data 202 may include page data that is decoded using current system parameters, e.g., adjusted read reference voltages to account for age and other factors but without using correction algorithms such as ECC. An XOR 206 of the raw page data 202 with associated reference data 204 will result in a value of one for any bits that don't agree between the two pages 202, 204, and zero for all other bits. The output 208 of the XOR operator 206 is then analyzed to increment "noise buckets" 210. Each bucket 210 holds a sum related to an error category, as indicated by column headings 212. There are 16 headings 211 for each column, each corresponding to the twelve types of errors 106, 108 shown in FIG. 1A, plus four columns corresponding to correctly read bits.

A processor 214 analyzes the noise buckets 210 and uses the data to adjust parameters 216. These parameters 216 may be page-specific, and/or be related to smaller or larger divisions of memory. As will be described in greater detail below, the parameters 216 may be used to adjust reference voltages used in programming/reading the pages. For example, reference voltages used in defining the data (e.g., $S_0$-$S_3$ and $R_0$-$R_2$ shown in FIG. 1A) may be adjusted based on magnitudes and directions associated with particular ones of the errors. In some implementations, the values of $S_0$ and $S_3$ may be fixed, although the other values may be adjusted.

To determine all values 212 for each of the buckets 210 in a multipage architecture, both MSB and LSB pages (see FIG. 1B) may need to be read to determine data 202 and 204. However, in some cases shortcuts can be taken. For example, if it is desired only to optimize LSB page read reference voltages, then obtaining a subset of the bucket categories 212 may be sufficient, and MSB pages need not to be read. The bucket computation can also be carried out over units larger or smaller than a page.

The actions performed by system 200 related to calculation of the buckets 210 may occur at any time in the life of the associated memory apparatus. At least some of the actions may be triggered by data access operations, such as reads, programs, erasures, garbage collection, error recovery mode, etc. The actions may also be performed based on time intervals and or usage statistics. Flash characteristics may degrade with program/erase (PE) cycles and retention time (e.g., time since data was last programmed/refreshed). As a result, it may be useful to perform the actions at different times over the life of the system 200.

Flash noise statistics as shown being gathered in FIG. 2 may be categorized at different time intervals for at least two reasons. One reason is to re-optimize the flash, such as re-optimizing reference voltages used in both read and write operations. This will tend to increase reliability and performance, e.g., less overhead associated with verification and error correction. Another reason to evaluate the noise buckets as shown in FIG. 2 is to effectively manage the life of the device. This may involve modifying ECC characteristics (e.g., codes used, number of ECC bits used) and when to retire different units on flash in particular. For example, the system may artificially increase the estimated life (which is often measured in terms of number of PE cycles) of particular pages/blocks due to the repeated occurrence of particular types of errors. This increase in estimated life may indicate to the system that the affected pages may be less reliable, and therefore should be used less and/or retired from use earlier. Additional examples of how these data may be utilized is described in U.S. Publication No. 2013/0094288 filed even date herewith, the entire content of which is incorporated by reference herein.

One example set of metrics that may be used to categorize MLC flash errors are conditional error probabilities. For example, the conditional error probabilities p(i,j) are defined as the probability of programmed symbol $s_i$ being detected as $s_j$. This may alternately be described as the probability of the expected symbol value in view of the actual symbol value detected. For the arrangement shown in FIG. 1A, p(i,j) may be expressed as $i \in \{11, 01, 00, 10\}$ and $j \in \{S_0, S_1, S_2, S_3\}$, the $S_n$ of the latter set generally indicating the regions 102-105 in FIG. 1A between boundaries $R_0$-$R_2$. There results in $M^2=16$ total such conditional probabilities total, with $M*(M-1)=12$ of the probabilities corresponding to a read error, e.g., p(i,j), $j \neq i$. If in a page there are $n_{ij}$ cells, that were programmed to $S_i$ level and read back as $S_j$, then p(i,j) can be estimated to be $p(i,j)=n_{ij}/N$, where N is the number of cells in a page. It is sometimes convenient to maintain the average value of $n_{ij}$ rather than p(i,j). The variable p(i,j) may be used herein to refer to both the raw counts and the conditional probability estimates, distinguishing between the two if needed.

In the example system 200, decoded digital data 202 and/or 204 is used as an indirect indicator of threshold voltages (and/or voltage ranges) detected within the cells in response to a read operation. This data 202, 204 is in turn used to populate data in the buckets 210. However, the system 200 may be adapted to determine the voltage data in other ways, and use alternate bucket categories with this data. For example, a flash memory may have provisions for reading read voltages directly. In such a case, a probability p(i,j) may be expressed as the probability of a cell programmed to $v_i$ threshold level being read back in the range $v_{1j}$-$v_{2j}$. These ranges may correspond to $S_0$-$S_3$ and/or $R_0$-$R_2$ shown in FIG. 1A, or may be of coarser or finer granularity. In such a case, the probabilities may still be used to form categories such as simple and complex, but may use delimiters for those categories that are different from those that indirectly determine voltages based on digital outputs.

Alternate probability distributions may be used in cases where MSB and LSB bits are determined separately using soft data read from the memory. Soft data generally refers to a technique of reading data that provides both an estimate of the stored binary value along with a reliability indicator. For example, multiple reads may be used in order to obtain higher resolution in soft information. In such a case, multiple read reference levels may need to be optimized. The choice of read reference voltage(s) may vary depending on whether the MSB or LSB bit is to be recovered, e.g., as indicated by the LSB and MSB regions in FIG. 1B. In addition, the probabilities will vary depending on the number of reads used to obtain the soft information.

In FIG. 3A, a diagram illustrates soft read results of an LSB page with three reads. For each soft decoded cell, the results of the soft read can be generalized as falling into four regions 302-305. In general, if k reads are used, then (k+1) regions are created. Bucket classification may be used with soft data, where the j in p(i,j) refers to a region 302-305 in FIG. 3A rather than a single detected cell voltage. This may be expressed p(i,j) where $i \in \{1, 0\}$ and $j \in \{$region 302, region 303, region 304, region 305$\}$. An alternate convention is also described below in relation to FIGS. 3B and 3C.

As an example, consider a cell programmed with an LSB of 0 where three reads are carried out as shown in FIG. 3A. Depending on the noise magnitude, the read value falls in one of the four regions 302-305. This determines which of the four buckets corresponding to the LSB being 0 to which the read value belongs. This is also illustrated in FIG. 3B, which show results 312-315 of three read values of the LSB. Each of the results 312-315 corresponds to respective ones of the four regions 302-305 shown in FIG. 3A. These results 312-315 may each correspond to one of the four buckets corresponding to the LSB being 0 or 1.

Another example of soft read results is shown in FIG. 3C, in which a table 320 shows specific values of eight p(i,j) buckets for the LSB soft read examples of FIGS. 3A and 3B. In general, with k reads, two sets of (k+1) buckets are obtained; one corresponding to the bit being 0 and the other to the bit being 1. This may be expressed p(i,j) where $i \in \{1, 0\}$ and $j \in \{[0,0,0], [1,0,0], [1,1,0], [1,1,1]\}$. It should be noted that the table 320 of FIG. 3C may also be generalized to soft information from MSB pages where three reads are used, although corresponding MSB voltage regions may be different from those shown in FIGS. 3A and 3B.

Some techniques for generating optimized reference voltage boundary values may use conditional probabilities as input. Other boundary generating methods may instead use the standard deviation or the variance of the noise associated with each signal $S_i$. Under the assumption of a given disturbance distribution, the conditional probabilities can be converted to standard deviations. For example, for the Gaussian distribution, the probability and the standard deviation are related by the Q-function. In such a case, one way of obtaining the standard deviation from conditional probability buckets is by using a Q-function look-up-table.

The conditional probabilities and/or error distributions generated as described above can be used in modifying read reference voltages and program verify voltages in the memory device. In reference now to FIG. 4A, a flowchart illustrates a procedure for adjusting read reference voltages according to an example embodiment. The procedure is a one-shot approach that determines, for a give boundary $R_i$, an indicator M that determines whether an adjustment to the boundary is needed. The procedure also produces an indicator S that determines a direction to adjust the reference voltage if the adjustment is needed. In this procedure, a multi-page architecture is assumed, so the probabilities are being determined for MSB and/or LSB soft data.

Figure 4A:
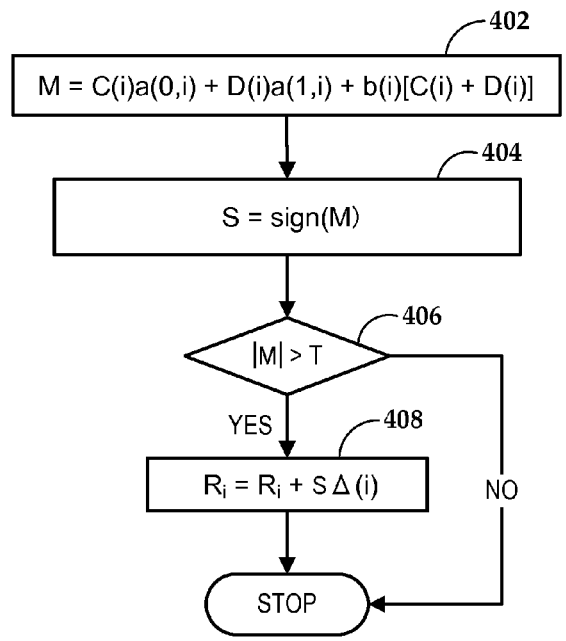
FIGS. 4A-4B are flowcharts illustrating procedures according to example embodiments.

The variable "i" in FIG. 4A expression is a counter that is incremented from 0 to k, where k is the number of reads used to provide the soft information associated with boundaries $R_i$ such as shown in FIGS. 3A and 3B. In those embodiments, the respective regions 302-305 and/or 312-315 are associated with values of i=0-3 as ordered from left to right. At block 402 in the flowchart of FIG. 4A, the value of M is expressed as the following functions:

$$M = C(i)a(L, i) + D(i)a(R, i) + b(i)[C(i) + D(i)] \quad [1]$$

$$a(l, i) = \ln\left(\frac{p(l, i)}{p(l, i+1)}\right), \quad [2]$$
$$l = LB, RB$$

$$b(i) = \ln\left(\frac{p(0, i+1) + p(1, i+1)}{p(0, i) + p(1, i)}\right), \quad [3]$$
$$l = 0, 1$$

The letters L and R refer to the value of the left and right bits. In FIG. 3A, L=1 and R=0. The quantities C(i) and D(i) in Equation [1] are dependent on the noise characteristics of the flash memory. Some examples of C(i) and D(i) are shown in Table 1 below. The noise parameters ($\sigma$, $\alpha$, b) in Table 1 can be obtained from the noise buckets. An example of how these parameters may be determined is described in U.S. Publication Nos. 2013/0094289 and 2013/0094286, filed even date herewith, the entire contents of which are incorporated by reference herein. The variables $s_0$ and $s_1$ in Table 1 are the voltage levels associated with the left bit and right bit, respectively.

TABLE 1

Noise Distribution Functions

| Type of noise | C(i) | D(i) |
|---|---|---|
| Gaussian | $\frac{1}{\sqrt{2\pi\sigma_0^2}}e^{-\left[\frac{(R_i-s_0)^2}{2\sigma_0^2}\right]}$ | $\frac{1}{\sqrt{2\pi\sigma_1^2}}e^{-\left[\frac{(R_i-s_1)^2}{2\sigma_1^2}\right]}$ |
| Exponentially decaying | $\alpha_0 e^{-\alpha_0(|R_i-s_0|)}$ | $\alpha_1 e^{-\alpha_1(|R_i-s_1|)}$ |
| Linearly decaying | $\frac{2}{b_0^2}\max(s_0+b_0-R_i, 0)$ | $\frac{2}{b_1^2}\max(R_i+b_1-s_1, 0)$ |

At block 404, the function sign(M) determines a direction of adjustment for the reference voltage R. The function sign (x) is defined as follows: sign(x)=1 if x≥0, otherwise=−1. At block 406, the magnitude of M is tested by comparison to a reference value T. The value of T may vary with i. If M is greater than or equal to T, then the voltage $R_i$ is adjusted 408 by a magnitude $\Delta(i)$ in the direction indicated by S calculated at block 402. The variable $\Delta(i)$ shown in block 408 is a relatively small value used to increment the reference voltage $R_i$, and may vary depending on which boundary is being adjusted. If it is determined 406 that |M|<T, then no adjustment 408 is performed.

Figure 4B:
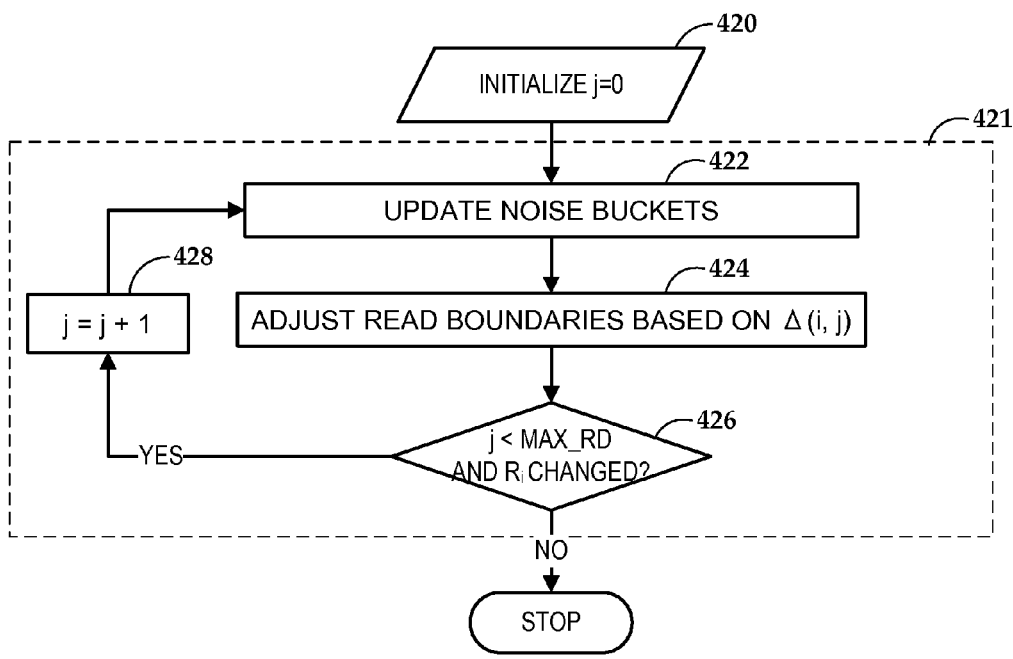

The procedure shown in FIG. 4A may be performed once for a given boundary $R_i$ at any time and under any circumstances described herein. The procedure of FIG. 4A may also be performed in an iterative process, e.g., based on multiple categorization and adjustment cycles. An example of this iterative process for adjusting read reference voltages according to an example embodiment is shown in the flowchart of FIG. 4B. The procedure begins by initializing 420 a count variable j to zero. The variable j is incremented within a loop 421, during which noise categories/buckets are updated 422 and read reference boundary voltages are adjusted 424.

The updating 422 of buckets/categories may be carried out as described in relation to FIG. 2. In this example, the data being analyzed is soft data, and so the buckets 210, categories 212, and/or operator 206 shown in FIG. 2 may be arranged appropriately for analyzing soft data for block 422. For example, the raw page data 202 and/or operator 206 may produce a collection of indicators for each bit of the reference page 204 that indicates the region of FIG. 3A or 3B from which the respective bit was read. The buckets 210 may include categories 212 that may not be considered as read errors, such as p(0,[0,0,0]).

The adjusting 424 of read reference voltages may be performed as shown and described in FIG. 4A. In this case, the value of $\Delta$ is expressed as $\Delta(i, j)$, indicating the amount that the reference boundary voltages are adjusted may change (e.g., decrease) with increasing j. The variable j is tested 426 and incremented 428 within the loop 421, until read errors are minimized (e.g., $R_i$ is unchanged between two consecutive steps) and/or a maximum count (MAX_RD) is reached. This procedure can be repeated for each read boundary to tested and/or modified.

The concept of noise buckets, in addition to being used for adjusting read levels, can be applied to program verify levels. Generally, a flash cell may be programmed by applying pulses of increasingly higher voltages to a cell. Each programming pulse is followed by a read operation to verify that the read voltage of a cell is greater than the program verify value. Adjusting program verify levels based on noise buckets can reduce read errors similar to the way that adjusting read thresholds can reduce read errors.

There may be complications in adjusting program verify levels based on noise buckets that may not exist for adjusting read boundaries. For example, as described above in relation to FIG. 2, noise buckets may be computed based on a read operation. This operation generally occurs at a particular device state that may be defined based on variables such as P-E cycles (or other measure of age/wear), retention time, disturb, etc. The value of variables can change over time, and so the conditions under which the memory is to be programmed may be substantially different than the conditions under which the noise bucket data was calculated. This can be addressed by extrapolating the collected information to the condition of interest.

Another factor to consider when adjusting program verify values based on noise buckets relates to multi-page architectures, e.g., where LSB and MSB of a cell are assigned to different pages. An example aspect of this architecture is illustrated in the block diagram of FIG. 5. Two MSB channels 502, 504 and an LSB channel 506 are input channels used to read respective MSB and LSB of pages for M=4 MLC flash cells. The channels 502, 504, 506 are defined by signal points 508-511. The LSB channel 506 reads from points 509 and 510 to determine whether the LSB is a one or zero. The MSB channel 502 uses signal points 508 and 509, and MSB channel 504 uses signal points 510 and 511. Channels 502 and 504 determine together whether the MSB is a 1 or 0 for the cell.

Figure 5:
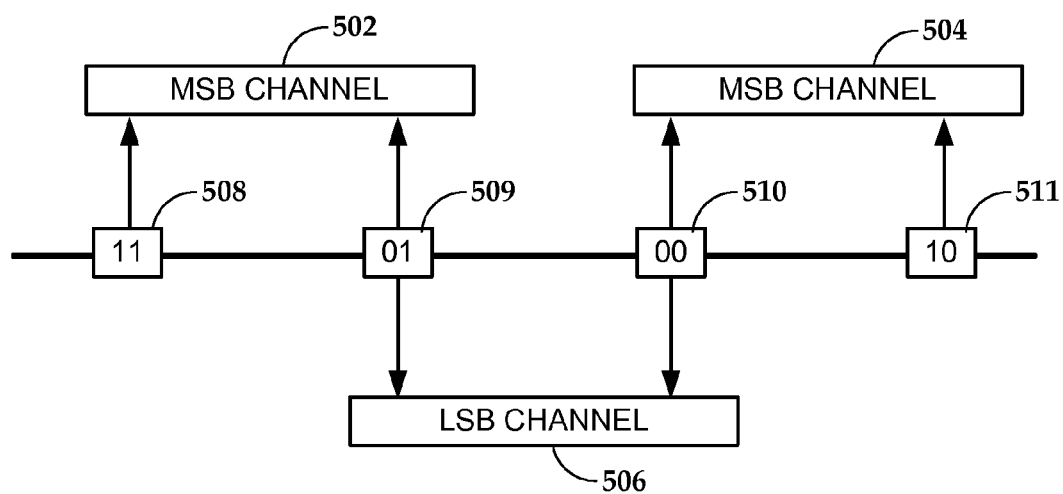
FIG. 5 is a block diagram illustrating multiple channels used to read soft information according to an example embodiment.
Figure 6:
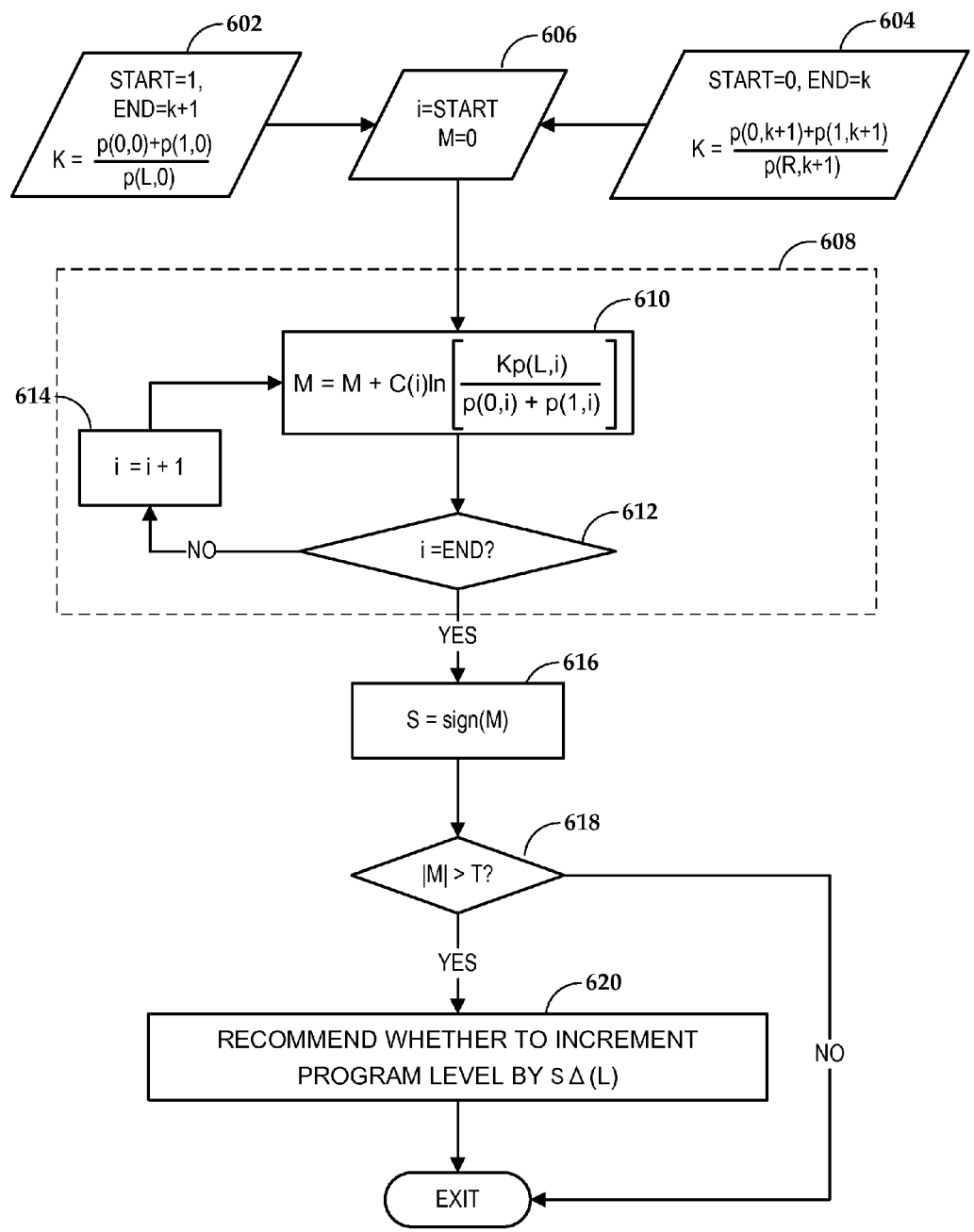
FIG. 6 is a flowchart illustrating an application of noise bucket categorization to program verify levels according to example embodiments.

As with read reference levels, two scenarios may be considered for determining if and how much program verify reference levels need to be modified. The first scenario considered is where only a single adjustment is performed. The process for performing under this condition is shown in the flowchart of FIG. 6. Depending on whether a left or right program verify level is being used (e.g., selected from signal points 508-511 shown in FIG. 5), one of two initializations 602, 604 may occur. These initializations select appropriate start values of loop 608, as well as defining an expression (referred to as "K") that is used in the calculation of the value M at block 610. At block 606, a loop counter variable "i" is set to the value START, which was defined at either block 602 or 604, and M is set to 0.

As shown in blocks 602 and 604, the variables L and R (representing left and right, respectively) are used as opposed to 0 and 1 in the previous examples. These variables refer to the value of bit associated with the left or right signal point of each channel, which can be 0 or 1. For example, the left value of channel 502 in FIG. 5 is 1 for the signal point 508, and the right value is 0 for the signal point 509. The opposite is true for channel 504 and signal points 510 and 511. As before, the "i" in p(L,i), represents one of the voltage regions shown in FIG. 5.

Upon entering the loop 608, the value of M is determined at block 610 using the indicated formula, which performs a natural logarithm (ln) operation on a function (in square brackets) of noise bucket probabilities. This noise bucket function depends in part on the value of K defined at 602 or 604. The natural logarithm in block 610 is multiplied by a distribution function C(i). The C(i) function is memory/distribution dependent, and can be found as shown above in Table 1. Some terms in the computation of M may be omitted, e.g., for some values of i, and/or where p(L,i) or p(R,i) are very small or zero.

At block 612, the loop iterator i is checked. The iterator is incremented at 614 if not equal to the END value defined at 602 or 604. Upon exiting the loop 608, the value S is determined 616 based on the sign of M, and the magnitude of M is checked 618 against a reference value T. If |M|>T, then a recommendation is made, a determination 620 is made as to whether the program value should be changed or not. Note that the change can either be an increase or decrease depending on the sign of S.

Changing program verify levels may affect multiple channels, and so the decision as to whether a program level should be modified may depend on results calculated for all of the channels. Therefore, the procedure in FIG. 6 may be part of a first step that determines whether to make program verify level changes overall, providing the recommendation at block 620 but not yet making any changes. Changes can done as a second step after all the channels have had recommendation values calculated. For example, a program reference level may be modified at the second step only if block 620 recommends a change for all of the channels affected by a program level. Such modification may also (or in the alternate) be contingent on whether the recommendations from the first step are consistent with one another.

In order to illustrate these steps, consider signal point 509 in FIG. 5, which affects both the LSB channel 506 and MSB channel 502. In the first step, the procedure of FIG. 6 is run on each of these channels 502, 506. If the result of running the first step is that the LSB channel 506 recommends an increase in the program level 509, but the MSB channel 502 recommends no change or a decrease, then the program level 509 may be left alone. On the other hand if both channels 502, 506 recommend the same change (either increase or decrease), the program level 509 corresponding to 01 is increased or decreased appropriately. The above two steps are repeated for each program verify level that may be targeted for modification.

In cases where full sequence programming is used (e.g., operating on both MSB and LSB at the same time), there may be no need to consider multiple binary inputs, as the data could be obtained via a single M-input channel. In such a case, the second step described above may not be needed. Other than this change, the process may be much the same as what is described for multipage programming, e.g., in FIG. 6.

Figure 7:
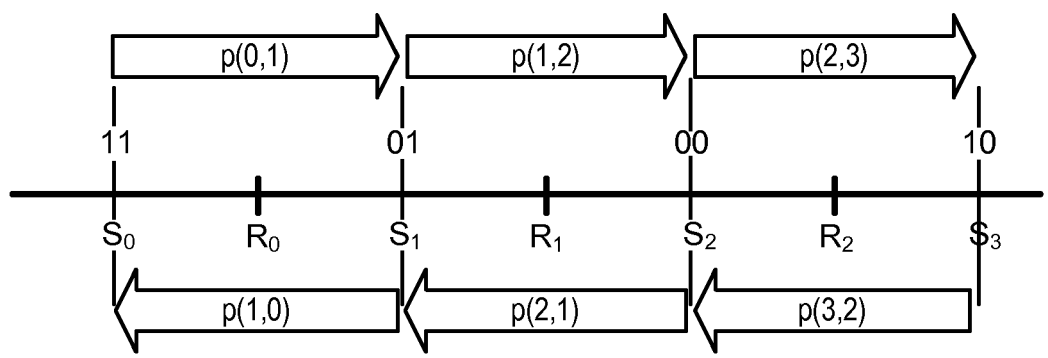
FIG. 7 is a block diagram illustrating a convention for categorizing data errors according to an example embodiment.

In the read boundary adjust procedure of FIG. 4 and program verify level adjustment procedure of FIG. 6, multiple reads may be used to obtain the soft data that populates the noise buckets. In cases where only a single read is used (e.g., hard data), an alternate set of calculations can be used. To calculate an adjustment indicator M for hard data, the expression M=p(i, i+1)−p(i+1, i) may be used at block 402 of FIG. 4. The convention for how the variable "i" is used in this case is illustrated in the graph of FIG. 7. For example, M=p(2,3)−p(3,2) would apply to determine an adjustment for reference level $R_2$. The magnitude of M in this case would be tested against reference value T (as in block 406 of FIG. 4) to determine whether to adjust $R_2$, and the sign of M would determine which direction to adjust $R_2$ (as in blocks 404 and 408 of FIG. 4).

In the case of using hard data for adjusting program verify levels, a plurality of tests against T may be used for each reference voltage $S_1$-$S_2$. In Table 2 below, four different values, $M_0$-$M_3$ are provided given using the numbering convention shown in FIG. 7. The second and third columns indicate whether the function is applicable to one of the two interior regions $S_1$ or $S_2$.

TABLE 2

Program Verify Level Functions for Hard Data

| Value | | Applies to $S_1$ | Applies to $S_2$ |
| --- | --- | --- | --- |
| $M_0$ | p(1, 2) − 2*p(1, 0) | Yes | No |
| $M_1$ | p(0, 1) + p(1, 0) + p(2, 3) + p(3, 2) − p(1, 2) − p(2, 1) | Yes | Yes |
| $M_2$ | p(0, 1) + p(1, 0) − p(2, 3) − p(3, 2) | Yes | Yes |
| $M_3$ | p(2, 1) − 2*p(2, 3) | No | Yes |

Figure 8:
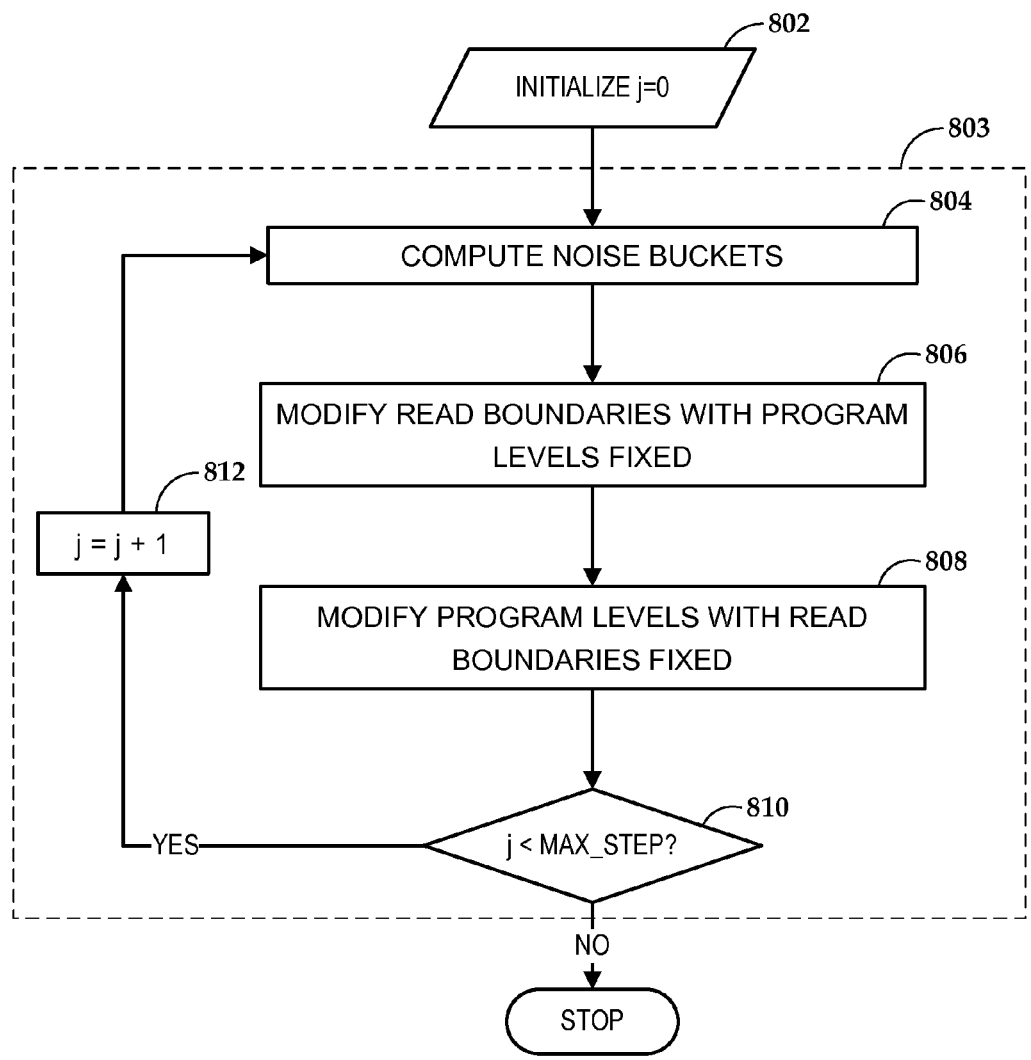
FIG. 8 is a flowchart of application of noise bucket categorization applied to read levels and program verify levels according to an example embodiment.

In the description so far, the program verify and read reference levels have been shown as being modified separately from one another. It is also possible to use noise buckets to modify both iteratively. An example of such a process according to an example embodiment is shown in the flowchart of FIG. 8. This process may work for both multipage and full sequence programming, as well as for hard and soft data.

In FIG. 8, a counter variable is initialized 802 for iterating through in loop 803. Noise buckets are computed 804 with the existing program and read levels. It may also be possible to obtain multiple sets of noise buckets by changing the read reference voltages at this block 804. At blocks 806 and 808 program and read levels are updated as previously described. The appropriate procedure for these updates 806, 808 may be chosen depending on whether the arrangement uses one set or multiple sets of noise buckets, hard or soft data, etc. Blocks 810, 812 cause the loop 803 to exit after a certain number of iterations. Other conditions (not shown) may also cause the procedure to exit the loop 803, such as small error rates found when computing noise buckets at 804.

Figure 9:
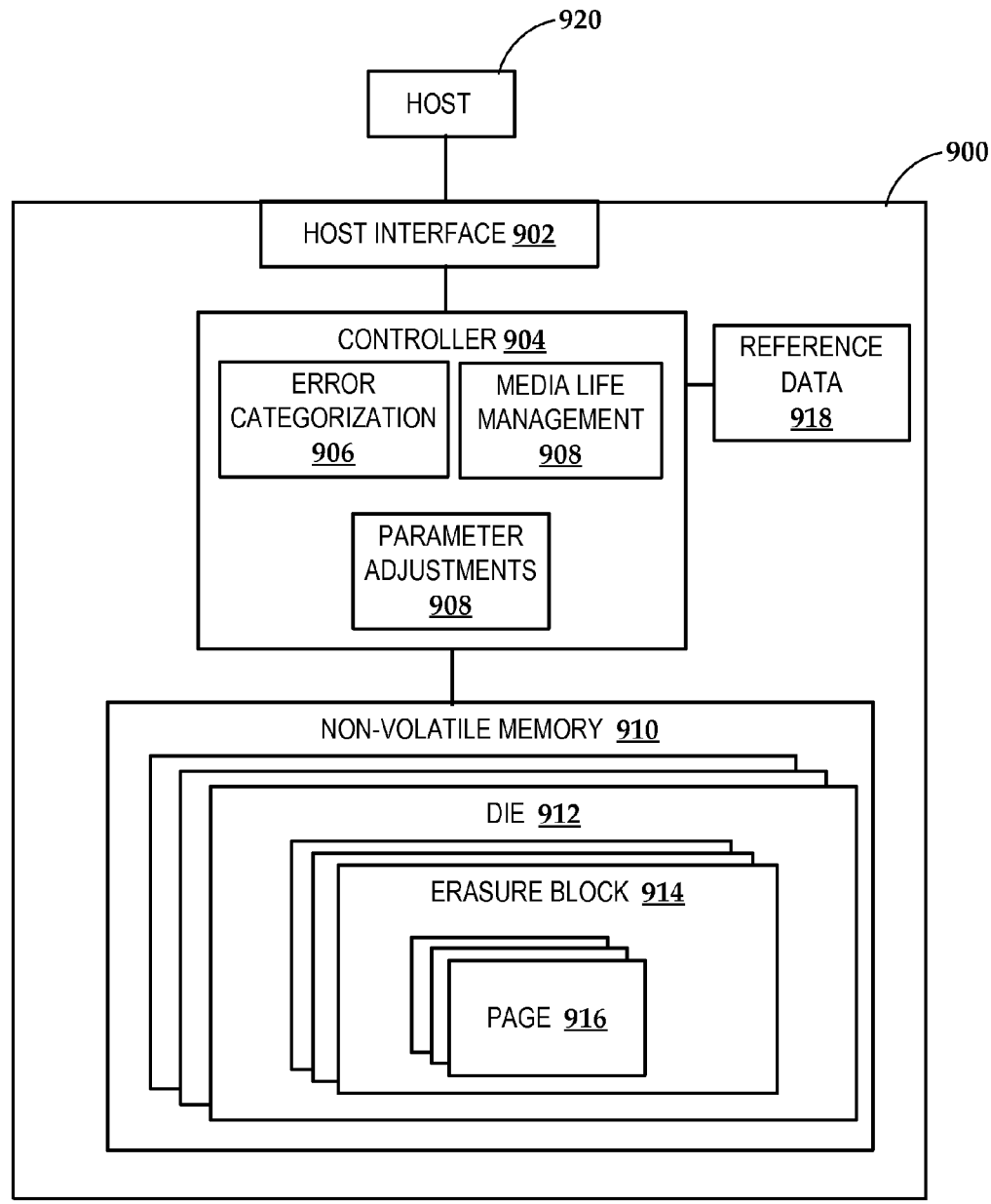
FIG. 9 is a block diagram of an apparatus according to an example embodiment.

In FIG. 9, a block diagram illustrates an apparatus 900 according to an example embodiment. The apparatus 900 may be any type of persistent solid-state storage device, including a solid-state drive (SSD), thumb drive, memory card, embedded device storage, etc. The apparatus 900 may include a host interface 902 that facilitates communications between the apparatus 900 and the host system 920, e.g., a computer. The apparatus 900 also includes media, here shown as solid-state, non-volatile memory 910. A host 920 can store data on the memory 910 and read data from the memory 910 via the host interface 902, which hides the operation of internal components of the apparatus 900 from the host 920.

The non-volatile memory 910 includes the circuitry and media used to persistently store both user data and other data managed internally by apparatus 900. The non-volatile memory 910 may include one or more flash dies 912, which individually contain a portion of the total storage capacity of the apparatus 900. The memory contained within individual dies 912 may be further partitioned into blocks, here annotated as erasure blocks/units 914. The erasure blocks 914 represent the smallest individually erasable portions of memory 910. The erasure blocks 914 in turn include a number of pages 916 that represent the smallest portion of data that can be individually programmed or read. In a NAND configuration, for example, the page sizes may range from 4 kilobytes (KB) or more, and the erasure block sizes may be on the order of one megabyte (MB). It will be appreciated that the present embodiments described herein are not limited to any particular size of the pages 916 and blocks 914, and may be equally applicable to smaller or larger data unit sizes.

The apparatus 900 includes one or more controllers 904, which may include general- or special-purpose processors that perform operations of the apparatus. The controller 904 may include any combination of microprocessors, digital signal processor (DSPs), application specific integrated circuits (ASICs), field programmable gate arrays (FPGAs), or other equivalent integrated or discrete logic circuitry suitable for performing the various functions described herein.

Functions that may be provided by the controller 904 include read/write operations, media life management, error categorization, and parameter adjustment, which are represented here respectively by functional modules 906-908. The modules 906-908 may be implemented using any combination of hardware, software, and firmware, and may cooperatively perform functions related to error analysis as described herein. Error categorization module 906 performs operations related to categorizing errors stored in the memory 910. These operations may include determining expected values of data stored in the memory 910, e.g., by looking at the stored data itself, or by use of reference data 918. The reference data 918 may be stored within or separate from the main memory 910, and may include duplicate data, additional ECC data, etc.

At some point in time, the error categorization module may make a comparison of data stored in memory 910 with reference data. This comparison may include, for example, a bitwise XOR that can be used to identify particular cells that exhibit errors, as well as physical characteristics of the error, e.g., magnitude and direction of floating gate voltage shifts that resulted in the error. This data may come from analog read/write channels, encoders, decoders that directly interact with the media 910. In some cases the underlying physical characteristics can be derived from digital results, e.g., based on hard decision values of the entire cell data as shown in FIG. 1A and/or soft decision values on MSB and/or LSB values as shown in FIGS. 3A and 3B.

The results obtained by the error characterization module 906 can be used by the media life management module 907 and by parameter adjustment module 908. The media life management module 907 monitors read/write operations and other factors related to wear and condition of the media 910. The module 907 may create and update statistics/metrics related to these operations, such as tracking program-erase cycles, time of operation, etc. The statistics may be updated based on patterns detected via the error characterization module 906.

The results obtained by the error characterization module 906 can be used by the parameter adjustment module 908 to make changes to parameters used in memory access operations. This may include adjustment of reference/boundary voltages used in reading, programming, verifying and/or erasing of particular pages 916, blocks 914 and/or dies 912. These adjustments may be applied iteratively, e.g., applying a first adjustment, measuring the result, applying a second adjustment, measuring the result, etc. At some point, the adjustments may either converge on one or more improved reference levels, or leave the levels unchanged.

Figure 10:
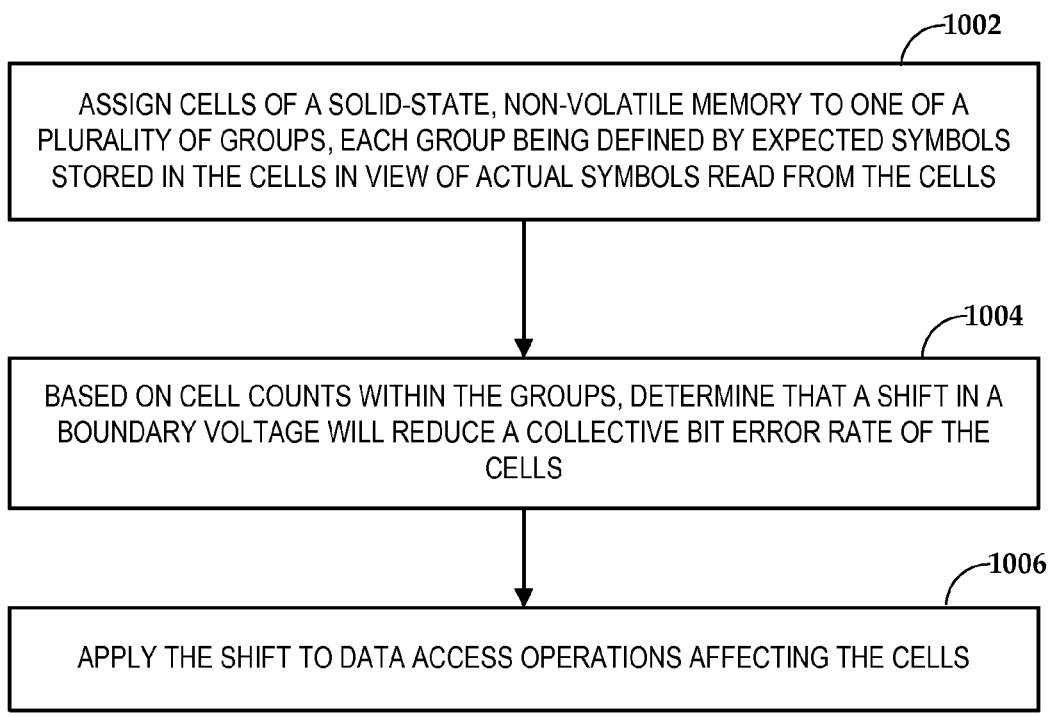
FIG. 10 is a flowchart of a procedure according to an example embodiment.

In reference now to FIG. 10, a flowchart illustrates a procedure according to an example embodiment. The procedure involves assigning 1002 cells of a solid-state, non-volatile memory to one of a plurality of groups. Each group is defined by expected symbols stored in the cells in view of actual symbols read from the cells. Based on cell counts within the groups, a shift in a reference voltage is determined 1004 to reduce a collective bit error rate of the cells. The reference voltage may include a boundary voltage associated with at least two soft data channels. In such a case, determining that the shift will reduce the collective bit error rate of the cells may optionally involve determining that the shift will reduce error rates consistently in the two or more soft data channels.

The shift is applied 1006 to data access operations affecting the cells. The data access operations may include any combination of read and program-verify operations. The assigning of the cells to the groups and the determining and applying of the shift may be performed iteratively two or more times. Where the data access operation is a program-verify operation, the assignment of cells to the groups may optionally be based on previously performed read operations. In such a case, the shift may be further modified based on one or more conditions affecting the cells, such as program-erase cycles, data retention time, and disturb.

The various embodiments described above may be implemented using circuitry and/or software modules that interact to provide particular results. One of skill in the computing arts can readily implement such described functionality, either at a modular level or as a whole, using knowledge generally known in the art. The structures and procedures shown above are only a representative example of embodiments that can be used to facilitate optimizing reference voltages for reading and programming of memory cells.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination are not meant to be limiting, but purely illustrative. It is intended that the scope be limited not with this detailed description, but rather determined by the claims appended hereto.

What is claimed is:

1. A method comprising:
assigning cells of a solid-state, non-volatile memory to one of a plurality of groups, wherein each group is defined by expected symbols stored in the cells in view of actual symbols read from the cells;
based on cell counts within the groups, determining that a shift in a reference voltage will reduce a collective bit error rate of the cells; and
applying the shift to data access operations affecting the cells;
wherein the data access operations comprise a program verify operation.

2. The method of claim 1, wherein the data access operations further comprise read operations.

3. The method of claim 2, wherein the assigning of the cells to the groups and the determining and applying of the shift are performed iteratively two or more times.

4. The method of claim 1, wherein the assigning of the cells to the groups and the determining and applying of the shift are performed iteratively two or more times.

5. The method of claim 1, wherein the reference voltage comprises a boundary voltage associated with at least two soft data channels, and wherein determining that the shift will reduce the collective bit error rate of the cells further comprises determining that the shift will reduce error rates consistently in the two or more soft data channels.

6. The method of claim 1, wherein the assignment of cells to the groups are based on previously performed read operations, and wherein the shift is further modified based on one or more conditions affecting the cells, the one or more conditions comprising any of program-erase cycles, data retention time, and disturb.

7. A method comprising:
assigning cells of a solid-state, non-volatile memory to one of a plurality of groups, wherein each group is defined by expected symbols stored in the cells in view of actual symbols read from the cells;
based on cell counts within the groups, determining that a shift in a reference voltage will reduce a collective bit error rate of the cells; and
applying the shift to data access operations affecting the cells;
wherein determining that the shift will reduce the collective bit error rate of the cells comprises evaluating an expression comprising a function $p(b,r)$ that refers to a number of cells having expected symbol values of b being read in voltage region r, wherein r represents regions adjacent the reference voltage.

8. The method of claim 7, wherein the expression is multiplied by a factor that is dependent on the noise characteristics of the flash memory.

9. An apparatus comprising:
a controller capable of being coupled to cells of a solid-state, non-volatile memory, the controller configured to perform:
assigning each of the cells to one of a plurality of groups, wherein each group is defined by expected symbols stored in the cells in view of actual symbols read from the cells;
based on cell counts within the groups, determining that a shift in a reference voltage will reduce a collective bit error rate of the cells; and
applying the shift to data access operations affecting the cells;
wherein the data access operations comprise a program verify operation.

10. The apparatus of claim 9, wherein the data access operations further comprise read operations.

11. The apparatus of claim 10, wherein the assigning of the cells to the groups and the determining and applying of the shift are performed iteratively two or more times.

12. The apparatus of claim 9, wherein the assigning of the cells to the groups and the determining and applying of the shift are performed iteratively two or more times.

13. The apparatus of claim 9, wherein the reference voltage comprises a boundary voltage associated with at least two soft data channels, and wherein determining that the shift will reduce the collective bit error rate of the cells further comprises determining that the shift will reduce error rates consistently in the two or more soft data channels.

14. The apparatus of claim 9, wherein the assignment of cells to the groups are based on previously performed read operations, and wherein the adjustments/shifts are further modified based on one or more conditions affecting the cells, the one or more conditions comprising any of program-erase cycles, data retention time, and disturb.

* * * * *